(12) United States Patent
Afzali-Ardakani et al.

(10) Patent No.: US 10,084,139 B2
(45) Date of Patent: Sep. 25, 2018

(54) FORMATION OF CARBON NANOTUBE-CONTAINING DEVICES

(71) Applicant: International Business Machines Corporation, Armonk, NY (US)

(72) Inventors: Ali Afzali-Ardakani, Ossining, NY (US); Bharat Kumar, Tarrytown, NY (US); George S. Tulevski, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/276,213

(22) Filed: Sep. 26, 2016

(65) Prior Publication Data

US 2017/0244040 A1    Aug. 24, 2017

Related U.S. Application Data

(62) Division of application No. 15/046,699, filed on Feb. 18, 2016.

(51) Int. Cl.
*H01L 29/06* (2006.01)
*H01L 51/00* (2006.01)
*H01L 51/05* (2006.01)

(52) U.S. Cl.
CPC ...... *H01L 51/0049* (2013.01); *H01L 51/0558* (2013.01)

(58) Field of Classification Search
CPC ...... B82Y 10/00; B82Y 40/00; C07D 213/76; C07D 213/79; H01L 29/0676; H01L 51/0003; H01L 51/0048; H01L 51/0049; H01L 51/0558; H01L 51/0007; H01L 2251/303; B23B 2231/52; B23B 31/261; B23Q 5/20; Y10T 279/34; Y10T 408/95; Y10T 409/309464; Y10T 483/1733
USPC ............ 257/29, 24, 9, 66, 369; 438/87, 197; 427/256; 264/346
See application file for complete search history.

(56) References Cited

U.S. PATENT DOCUMENTS

| | | | |
|---|---|---|---|
| 6,277,318 B1 * | 8/2001 | Bower | B82Y 30/00 264/235 |
| 6,969,690 B2 * | 11/2005 | Zhou | B05D 1/185 430/5 |
| 7,504,132 B2 | 3/2009 | Afzali-Ardakani et al. | |

(Continued)

OTHER PUBLICATIONS

Park, et al., "High-density Integration of Carbon Nanotubes Via Chemical Self-assembly", Nature Nanotechnology, Letters, Oct. 2012, pp. 787-791.

(Continued)

*Primary Examiner* — Mohammed Shamsuzzaman
(74) *Attorney, Agent, or Firm* — Tutunjian & Bitetto, P.C.; Vazken Alexanian

(57) ABSTRACT

A method of fabricating a carbon nanotube based device, including forming a trench having a bottom surface and sidewalls on a substrate, selectively depositing a bi-functional compound having two reactive moieties in the trench, wherein a first of the two reactive moieties selectively binds to the bottom surface, converting a second of the two reactive moieties to a diazonium salt; and reacting the diazonium salt with a dispersion of carbon nanotubes to form a carbon nanotube layer bound to the bottom surface of the trench.

5 Claims, 2 Drawing Sheets

(56) References Cited

U.S. PATENT DOCUMENTS

| | | | |
|---|---|---|---|
| 7,692,249 B2* | 4/2010 | Zhang | B82Y 10/00 257/369 |
| 7,730,610 B2* | 6/2010 | Nakagawa | H01L 21/67144 29/831 |
| 7,892,517 B2 | 2/2011 | Tour et al. | |
| 8,138,102 B2* | 3/2012 | Afzali-Ardakani | B82Y 10/00 438/780 |
| 8,647,490 B2* | 2/2014 | Choi | C25D 1/04 205/341 |
| 8,772,782 B2* | 7/2014 | Cao | B82Y 10/00 257/192 |
| 8,785,309 B2 | 7/2014 | Kastalsky | |
| 8,859,048 B2* | 10/2014 | Afzali-Ardakani | B82Y 30/00 427/256 |
| 8,895,371 B2 | 11/2014 | Cao et al. | |
| 2007/0264764 A1* | 11/2007 | Afzali-Ardakani | B82Y 10/00 438/197 |
| 2009/0042136 A1* | 2/2009 | Tour | B82Y 10/00 430/296 |
| 2009/0117277 A1* | 5/2009 | Afzali-Ardakani | B05D 1/283 427/256 |
| 2010/0044678 A1* | 2/2010 | Afzali-Ardakani | B82Y 10/00 257/24 |
| 2011/0163296 A1* | 7/2011 | Pace | B82Y 15/00 257/24 |
| 2013/0082233 A1* | 4/2013 | Afzali-Ardakani | C07D 213/76 257/9 |
| 2014/0184196 A1* | 7/2014 | Lieber | G01N 27/4146 324/92 |

OTHER PUBLICATIONS

Tulevski, et al., "Chemically Assisted Directed Assembly of Carbon Nanotubes for the Fabrication of Large-Scale Device Arrays", JACS Articles, Sep. 2007, pp. 11964-11968.

Zhang, et al., "Air-Stable Conversion of Separated Carbon Nanotube Thin-Film Transistors from p-Type to n-Type Using Atomic Layer Deposition of High-κ Oxide and Its Application in CMOS Logic Circuits", ACS NANO, Mar. 2011, pp. 3284-3292, vol. 5, No. 4.

List of IBM Patents or Patent Applications Treated as Related dated Sep. 26, 2016, 2 pages.

* cited by examiner

FORMATION OF CARBON NANOTUBE-CONTAINING DEVICES

BACKGROUND

Technical Field

The present invention relates to a semiconductor structure, and more particularly to fabrication of a transistor structure self-assembled carbon nanotube (CNT) technology.

Description of the Related Art

Carbon nanotubes (CNT) possess properties that make them an optional material for use in various electronic devices, such as field effect transistors (FETs). The CNT may be used in place of silicon for a channel material, however, use of CNTs involves forming a useful layer of the material in a controlled and/or predictable manner. Although different attempts have been made to prepare such CNT layers, further improvements would be beneficial.

SUMMARY

A method of fabricating a carbon nanotube based device, including forming a trench having a bottom surface and sidewalls on a substrate, selectively depositing a bi-functional compound having two reactive moieties in the trench, wherein a first of the two reactive moieties selectively binds to the bottom surface, converting a second of the two reactive moieties to a diazonium salt; and reacting the diazonium salt with a dispersion of carbon nanotubes to form a carbon nanotube layer bound to the bottom surface of the trench.

A method of fabricating a carbon nanotube based device, including forming a metal oxide layer on a substrate, wherein the metal oxide layer has an exposed surface, forming one or more non-metal oxide islands on the metal oxide layer, wherein portions of an underlying metal oxide layer surface remain exposed, contacting at least the exposed portions of the underlying metal oxide layer surface with a solution of a bi-functional compound including an aniline moiety and a hydroxamic acid moiety to form a monolayer on the exposed portions of the underlying metal oxide layer surface, reacting the aniline moiety to form a functionalized bi-functional compound, and contacting the functionalized bi-functional compound with a carbon nanotube dispersion to form carbon nanotubes bound to the functionalized bi-functional compound.

A carbon nanotube based device, including a substrate, a metal oxide layer on the substrate, a plurality of non-metal oxide islands on the metal oxide layer forming a trench between the non-metal oxide islands, a monolayer of a bifunctional compound in the trench, wherein the bifunctional compound is selectively chemically adsorbed onto the metal oxide layer, and a plurality of carbon nanotubes chemically bonded to the monolayer of the bifunctional compound.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
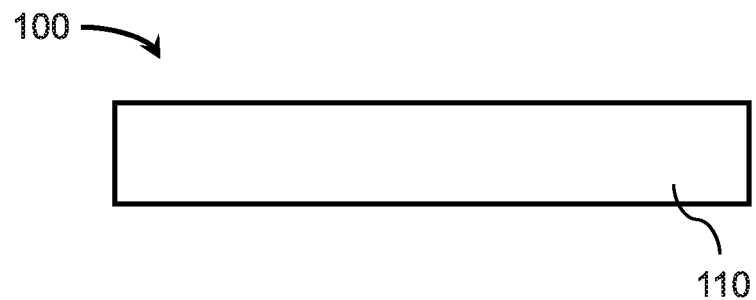
FIG. 1 is a cross-sectional diagram of a CNT-based device in accordance with an exemplary embodiment.

Principles and embodiments of the present disclosure relate generally to a semiconductor structure including carbon nanotubes, where the CNTs form a layer of the structure. The structure may be part of a semiconductor device or form a complete semiconductor device. In various embodiments, the semiconductor device may be a transistor, or more particularly a field effect transistor (FET), where the carbon nanotubes replace silicon as the channel material. It is also contemplated that two or more semiconductor devices may also be combined to form a logic device, for example, a CMOS device or a gate device.

Principles and embodiments also relate to a field effect transistor having a channel layer formed by self-assembled carbon nanotubes, where the carbon nanotubes deposit as a monolayer in a defined recess in the device surface.

It should be understood that reference to carbon nanotubes is for descriptive purposes only and intended to encompass the different varieties of 1-D and 2-D nanostructures, including but not limited to single-walled nanotubes (SWNTs), double-walled carbon nanotubes (DWNTs), multi-walled nanotubes (MWNTs), and chemically modified nanotubes.

In various embodiments, the carbon nanotubes are not reacted with other surface active agents (surfactants) to control or modify placement of the CNTs on a surface. In various embodiments, the carbon nanotubes are not associated with one or more compounds having at least one functional group prior to placement on a surface. In various embodiments, the placement of the carbon nanotubes onto prescribed locations on the surface of a substrate may be accomplished without chemically (e.g., functionalizing the CNTs with a moiety) or physically (e.g., associating a moiety with the CNT by physical interaction(s), for example, entanglement, polymer wrapping, or physisorption).

In one or more embodiments, carbon nanotubes suspended in organic solvent(s) may be selectively placed onto pre-patterned surfaces using diazonium chemistry. A surface may be pre-patterned using a bi-functional compound having an aniline moiety and a hydroxamic acid moiety. A surface-reactive agent may be end-functionalized to include an aniline moiety on one end and a hydroxamic acid moiety on the other end of the molecule. (See Formula I).

$$R'(HO)N(O)C-R^1-C_6H_4-N\equiv N(Cl) \qquad (I)$$

In one or more embodiments, R¹ may be an aliphatic (—CH₂—) chain with a length in the range of C1 to C18, or C3 to C12, a cyclic aliphatic having a ring size in the range of C5 to C7, or a combination thereof. In various embodiments, the bi-functional compound may have the following structure, (see Formula II):

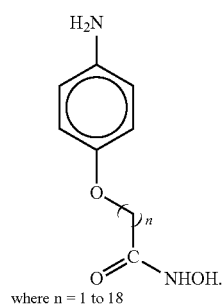

(II)

where n = 1 to 18

In various embodiments, a monolayer may be formed by the bifunctional compound including a hydroxamic acid group at one end of an aliphatic chain and an aniline functional group on the opposite end of the aliphatic chain, where the hydroxamic acid group binds to the metal oxide surface. The bi-functional compound may form the monolayer on a surface by having the hydroxamic acid moiety selectively bind to a metal oxide surface region.

In various embodiments, an aniline moiety may be converted to a diazonium salt with the addition of amyl nitrite, and the diazonium salt reacted with a carbon nanotube to chemically bind the carbon nanotube to the metal oxide surface region. (See Formula III).

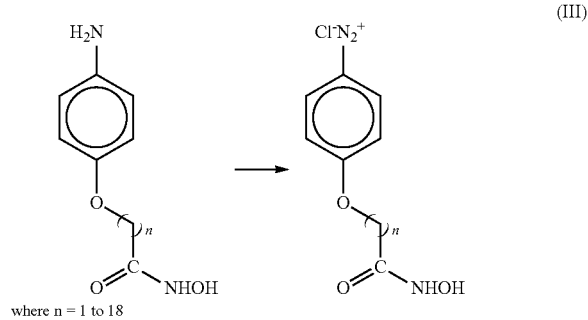

(III)

where n = 1 to 18

A monolayer may be formed by the bifunctional compound including a hydroxamic acid group at one end of an aliphatic chain and the diazonium salt on the opposite end of the aliphatic chain, where the hydroxamic acid group binds to the metal oxide surface carbon nanotube and the diazonium salt binds to the carbon nanotubes. (See Formula IV).

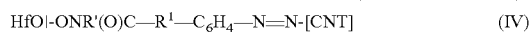

(IV)

In various embodiments, the hydroxamic acid moiety selectively binds to the surface oxygens through the carbonyl group and the hydroxyl group to form a seven-membered cyclic structure. The bi-functional compound selectively binds to the oxygens of the metal oxide (e.g., HfO₂, Al₂O₃, etc.) over the non-metal oxides (e.g., SiO₂). Without being bound by theory, it is believed that the basic surface of the metal oxide, which can have an isoelectric point of about 6 to about 9, reacts with the acidic hydroxamic acid moiety to form the cyclic structure through two bonds.

In one or more embodiments, the end of the bi-functional compound not bound to the metal oxide surface may be reacted to form a diazonium salt in situ by reaction with a nitrite.

In various embodiments, a plurality of CNTs may bond to the bi-functional compound monolayer on the metal oxide surface. Each CNT may bond to one or more bi-functional compounds.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

While exemplary embodiments have been shown for a particular device, it should be understood that a plurality of such devices may be arranged and/or fabricated on a substrate to form integrated devices that may be integrated onto a substrate, for example through very large scale integration to produce complex devices such a central processing units (CPUs) and application specific integrated circuits (ASICs).

Referring now to the drawings in which like numerals represent the same or similar elements and initially to FIG. 1, which is a cross-sectional diagram of a CNT-based device in accordance with an exemplary embodiment.

In one or more embodiments, a CNT-based device 100 includes a substrate 110. A substrate 110 may be a metal, semiconductor, or an insulator. The substrate 110 may be crystalline, semi-crystalline, microcrystaline, or amorphous. A metal substrate may be, for example, aluminum, hafnium, copper, titanium, as well as other metals that form a thin layer of oxide on the surface that can bind with hydroxamic acids. A semiconductor substrate may be essentially (i.e., except for contaminants) a single element (e.g., silicon), primarily (i.e., with doping) of a single element, for example, silicon (Si) or germanium (Ge), or the substrate may be a compound, for example, GaAs, SiC, or SiGe. An insulator substrate may be aluminum oxide ($Al_2O_3$), silicon oxide ($SiO_2$), etc. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 100 may be a silicon wafer. In an embodiment, the substrate is a single crystal silicon wafer.

Figure 2:
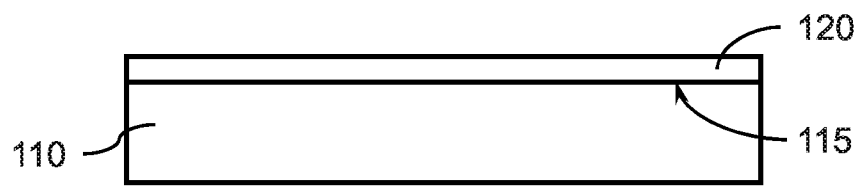
FIG. 2 is a cross-sectional view of a CNT-based device shown in FIG. 1 with a metal oxide layer in accordance with an exemplary embodiment.

FIG. 2 is a cross-sectional view of a CNT-based device shown in FIG. 1 with a metal oxide layer in accordance with an exemplary embodiment.

In various embodiments, a metal oxide layer 120 may be formed on the surface 115 of the substrate 110. The metal oxide layer 120 may have a surface 115 that can form a chemical bond with a hydroxamic acid (—C(O)NR'OH) moiety. In various embodiments, the metal oxide layer 120 may be a high-k oxide. The metal oxide layer 120 may be selected from the group consisting of $HfO_2$, $ZrO_2$, HfSiO, HfSiON, $TiO_2$, $Y_2O_3$, $Al_2O_3$, $Ta_2O_5$, $InBaTiO_3$, $BaSrTiO_3$ (BST), $SrTiO_3$, and combinations thereof. In one or more embodiments, the metal oxide layer 120 may be $HfO_2$, $ZrO_2$, $TiO_2$, or $Ta_2O_5$.

In embodiments in which the substrate is a metal, the substrate may have an oxide layer suitable for binding to the hydroxamic acid (—C(O)NR'OH) moiety, or be treated to form an oxide layer suitable for binding to the hydroxamic acid (—C(O)NR'OH) moiety.

In various embodiments, the metal oxide layer 120 may have a thickness in the range of about 1 nm to about 100 nm, or in the range of about 5 nm to about 20 nm, although other thicknesses are contemplated, and a metal substrate having a much greater thickness may be used.

The metal oxide layer 120 may be formed on the exposed surface 115 of the substrate 110, where the metal oxide layer 120 may be formed by one or more deposition processes (e.g., physical vapor deposition, chemical vapor deposition, atomic layer deposition), spin coating, or combinations thereof. The metal oxide layer 120 and exposed surface 115 of substrate 110 may form an interface, where the metal oxide layer 120 and exposed surface 115 are in contact.

Figure 3:
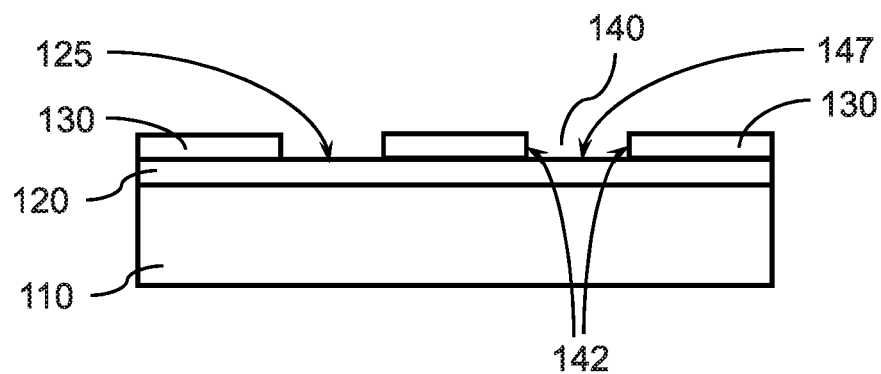
FIG. 3 is a cross-sectional view of a CNT-based device shown in FIG. 2 with a patterned oxide layer in accordance with an exemplary embodiment.

FIG. 3 is a cross-sectional view of a CNT-based device shown in FIG. 2 with a patterned oxide layer in accordance with an exemplary embodiment.

In one or more embodiments, a patterned non-metal oxide layer may be formed on the metal oxide layer 120 to create non-metal oxide islands 130. In various embodiments, the non-metal oxide layer and non-metal oxide islands may be silicon dioxide ($SiO_2$), silicon oxynitride (SiON), germanium oxide ($GeO_2$), hydrogen silsesquioxane (HSQ), polysilicon, silicon, etc. The non-metal oxide islands 130 may also be made of precious metals, including gold, silver, platinum, and palladium.

In one or more embodiments, a layer of non-metal oxide may be deposited on at least a portion of the metal oxide layer 120. A masking material may be deposited over the non-metal oxide layer and patterned to form masked regions and exposed regions, as would be known in the art, and portions of non-metal oxide layer removed by etching to expose regions of the underlying metal oxide layer surface 125.

In one or more embodiments, a masking material may be deposited over the metal oxide layer 120 and patterned to form masked region(s) and exposed region(s) of the metal oxide layer surface 125, as would be known in the art. Non-metal oxide islands 130 may be deposited on the exposed region(s) of the metal oxide layer 120, and the masking material removed to expose the underlying metal oxide layer surface 125.

In various embodiments, the non-metal oxide islands 130 may have a thickness in the range of about 1 nm to about 100 nm, or in the range of about 5 nm to about 20 nm. The non-metal oxide islands 130 may have widths in the range of about 5 nm to about 500 nm, or in the range of about 10 nm to about 100 nm.

In various embodiments, the non-metal oxide islands 130 form the sidewalls 142 of a trench 140, and the underlying metal oxide layer surface forms the bottom surface 147 of the trench 140, where the trench 140 has a depth equal to the thickness of the non-metal oxide islands 130.

One or more embodiments may include annealing the substrate, the layer of the metal oxide on the substrate, and the patterned non-metal oxide layer on the metal oxide layer at a temperature in the range of about 400° C. to about 600° C.

Figure 4:
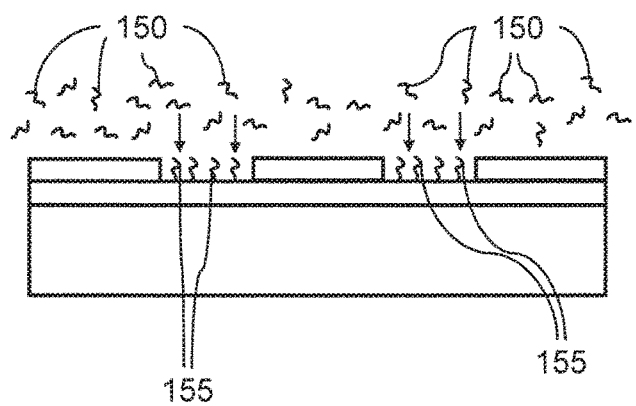
FIG. 4 is a cross-sectional view of a CNT-based device shown in FIG. 3 with a bi-functional compound on the exposed portions of the underlying metal oxide layer surface in accordance with an exemplary embodiment.

FIG. 4 is a cross-sectional view of a CNT-based device shown in FIG. 3 with a bi-functional compound on the exposed portions of the underlying metal oxide layer surface in accordance with an exemplary embodiment.

In one or more embodiments, the CNT-based device 100 may be placed in a solution of a bi-functional compound 150, such that exposed portions of the underlying metal oxide layer surface may come in contact with the bi-functional compound 150 in solution. A functional moiety of the bi-functional compound 150 may bond with the exposed surface(s) of the metal oxide layer surface 125, while not bonding with the exposed surfaces of the non-metal oxide islands 130. In various embodiments, a hydroxamic acid (—C(O)NR'OH), where R' may be a hydrogen, moiety of the bi-functional compound 150 chemically bonds to the metal oxide forming the bottom surface 147 of the trench 140.

In various embodiments, the CNT-based device 100 may be removed from the solution of the bi-functional compound and rinsed to remove bi-functional compound that has not been bound to the metal oxide layer surface 125. The bound bi-functional compound 155 may form a chemisorbed monolayer along the bottom surface 147 of the trench(es) 140.

Figure 5:
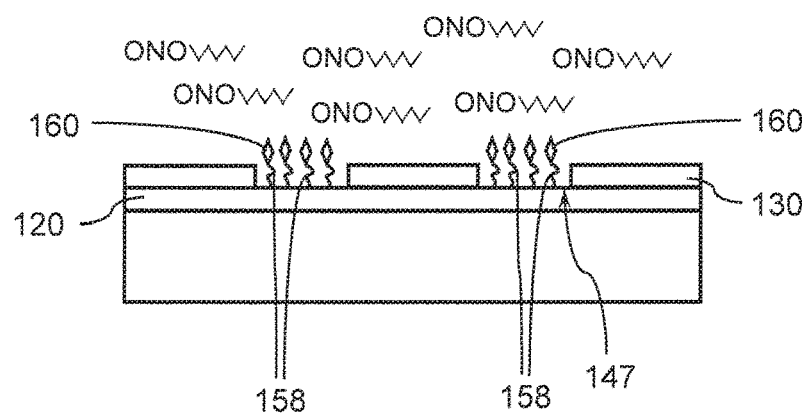
FIG. 5 is a cross-sectional view of a CNT-based device shown in FIG. 4 with a functionalized bi-functional compound on the exposed portions of the underlying metal oxide layer surface in accordance with an exemplary embodiment.

FIG. 5 is a cross-sectional view of a CNT-based device shown in FIG. 4 with a functionalized bi-functional compound on the exposed portions of the underlying metal oxide layer surface in accordance with an exemplary embodiment.

In one or more embodiments, the chemically bound bi-functional compound 155 may be exposed to a solution of an alkyl nitrite, cycloalkyl nitrite, or aryl nitrite (R—ONO), nitrosonium tetrafluoroborate ($NO^+:BF_4^-$), or aqueous sodium nitrite ($NaNO_2$) in the presence of an acid to form a functionalized bi-functional compound 158 on the bottom surface 147 of the trench(es) 140. In various embodiments, the alkyl nitrite may be selected from the group consisting of pentyl nitrite, 3-methylbutyl nitrite, 2-methylbutyl nitrite, or combinations thereof.

In various embodiments, the nitrosonium tetrafluoroborate ($NO^+:BF_4^-$), aqueous sodium nitrite ($NaNO_2$) in the presence of an acid, alkyl nitrite, cycloalkyl nitrite, or aryl nitrite (R—ONO) reacts with an aniline moiety of the bi-functional compound 155 to form a diazonium salt moiety 160. The diazonium salt moiety may reacted with a carbon nanotube to chemically bind the carbon nanotube to the metal oxide surface region through the functionalized bi-functional compound 158. The functionalized bi-functional compound 158 anchors the carbon nanotubes 170 to the bottom surface 147 of the trench 140.

Figure 6:
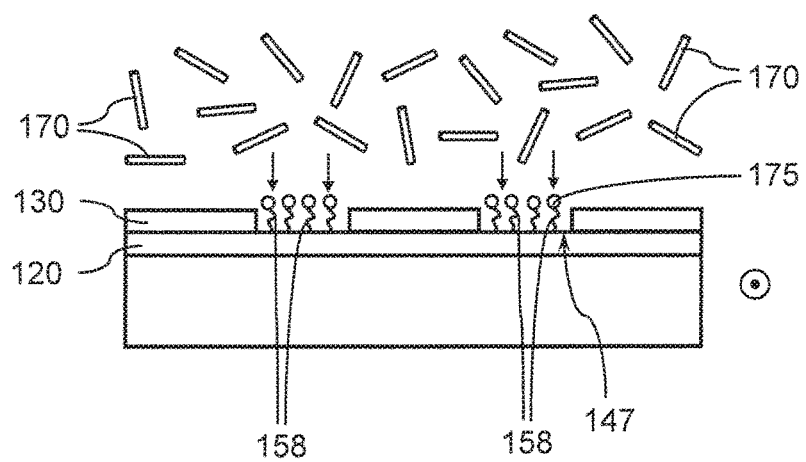
FIG. 6 is a cross-sectional view of a CNT-based device with carbon nanotubes (CNTs) bound to the functionalized bi-functional compound, as shown in FIG. 5 in accordance with an exemplary embodiment.

FIG. 6 is a cross-sectional view of a CNT-based device with carbon nanotubes (CNTs) bound to the functionalized bi-functional compound, as shown in FIG. 5 in accordance with an embodiment.

In one or more embodiments, the CNT-based device 100 with the functionalized bi-functional compound 158 may be exposed to a dispersion of carbon nanotubes 170 in an organic solvent. In various embodiments, the organic solvent may be toluene, tetrahydrofuran (THF), xylenes, dichloromethane ($CH_2Cl_2$), or chloroform ($CHCl_3$). The CNTs may be suspended in the organic solvent, where then may interact with the functionalized bi-functional compound 158 bound to the bottom surface 147 of the trench(es) 140. The CNTs may chemically bond to the diazonium salt moiety 160 of the functionalized bi-functional compound 158, which extends out into the dispersion of carbon nanotubes. The diazonium salts may form charge transfer complexes with the carbon nanotubes 170, which may then react to form covalent bonds with the CNT surface. The carbon nanotubes (CNTs) 175 are bound to the functionalized bi-functional compound 158.

In various embodiments, the carbon nanotubes have a length in the range of about 100 nm to about 2000 nm, or about 300 nm to about 600 nm.

In various embodiments, the CNTs may react with one or more functionalized bi-functional compound(s) 158. As the CNTs react with a plurality of functionalized bi-functional compound 158, the carbon nanotubes 170 may become aligned in a direction parallel to the long axis of the trench 140. The CNTs may also align first along the long axis of a trench 140 followed by reacting with the diazonium salt and formation of a covalent bond. Alignment of the carbon nanotubes may provide electronic overlap between neighboring CNTs in a trench to form a conductive path along the axis of the trench. Such alignment of the carbon nanotubes may provide superior electrical connection yields that are sufficient to build electrical devices on the surface of at least the CNT-filled trench.

In various embodiments, the CNT layer may have a thickness in the range of about 1 nm to about 10 nm, or about 1 nm to about 5 nm.

In various embodiments, trenches formed by the non-metal oxide islands and the metal oxide layer may have a width in the range of about 10 nm to about 1000 nm, and a length in the range of about 300 nm to about 2000 nm. In various embodiments, trenches formed by the non-metal oxide islands and the metal oxide layer may have a width in the range of about 30 nm to about 500 nm, and a length in the range of about 500 nm to about 1500 nm.

In a non-limiting example of an embodiment, a patterned substrate was annealed for 30 minutes at 600° C. The annealed substrate was dipped into a 5 mM toluene/ethanol (1:1) solution of arylamine hydroxamic acid for 1 hour. The substrate was then rinsed with ethanol for 1 minute and dried The substrate was subsequently dipped into a sorted CNT-polymer solution for 1 hour. The substrate was subsequently dipped into an amyl nitrite solution for 30 minutes. It was taken out and rinsed with toluene for 1 minute and ethanol for 1 minute. The patterned substrate with a deposited CNT layer was dried by blowing nitrogen over the surface followed by sonication in toluene for 5 minutes and ethanol for 15 minutes. The CNTs have been selectively deposited onto hafnium oxide trenches 150 nm wide.

Having described preferred embodiments of carbon nanotube based devices and fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:
1. A carbon nanotube based device, comprising:
a recess on a substrate, wherein the recess has a metal oxide bottom surface; and
a monolayer of only carbon nanotubes not modified by one or more compounds having at least one functional group bound to the bottom surface of the recess through a functionalized bi-functional compound, wherein the bi-functional compound has the formula of

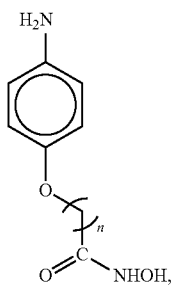

where n = 1 to 18 and wherein a first reactive moiety of the functionalized bi-functional compound is a hydroxamic acid moiety (—C(O)NR'OH), where R' is a hydrogen, selectively bonded directly to the exposed bottom surface, and a second reactive moiety of the functionalized bi-functional compound is a diazonium salt moiety bonded directly to the carbon nanotubes.

2. The carbon nanotube based device of claim 1, wherein the carbon nanotubes forming the monolayer have a length in the range of about 100 nm to about 2000 nm.

3. The carbon nanotube based device of claim 1, wherein the carbon nanotubes are aligned in a direction parallel to a long axis of the recess.

4. The carbon nanotube based device of claim 3, wherein the alignment of the carbon nanotubes (CNTs) provides electronic overlap between neighboring CNTs in the recess to form a conductive path along the long axis of the recess.

5. The carbon nanotube based device of claim 1, wherein the metal oxide layer is selected from the group consisting of $HfO_2$, $ZrO_2$, HfSiO, HfSiON, $TiO_2$, $Y_2O_3$, $Al_2O_3$, $Ta_2O_5$, $InBaTiO_3$, $BaSrTiO_3$ (BST), $SrTiO_3$, and combinations thereof.

* * * * *